(12) United States Patent
Kim et al.

(10) Patent No.: US 7,105,460 B2
(45) Date of Patent: Sep. 12, 2006

(54) NITROGEN-FREE DIELECTRIC ANTI-REFLECTIVE COATING AND HARDMASK

(75) Inventors: Bok Hoen Kim, San Jose, CA (US); Sudha Rathi, San Jose, CA (US); Sang H. Ahn, Santa Clara, CA (US); Christopher D. Bencher, San Jose, CA (US); Yuxiang May Wang, Palo Alto, CA (US); Hichem M'Saad, Santa Clara, CA (US); Mario D. Silvetti, Morgan Hill, CA (US)

(73) Assignee: Applied Materials, Santa Clara, CA (US)

( * ) Notice: Subject to any disclaimer, the term of this patent is extended or adjusted under 35 U.S.C. 154(b) by 583 days.

(21) Appl. No.: 10/193,489

(22) Filed: Jul. 11, 2002

(65) Prior Publication Data

US 2004/0009676 A1 Jan. 15, 2004

(51) Int. Cl.
*H01L 21/31* (2006.01)

(52) U.S. Cl. .................. 438/778; 438/710; 438/725; 438/763; 438/780; 438/789; 438/790

(58) Field of Classification Search ............ 438/710, 438/725, 763, 778, 780, 790, 789
See application file for complete search history.

(56) References Cited

U.S. PATENT DOCUMENTS

| | | | |
|---|---|---|---|
| 5,186,718 A | 2/1993 | Tepman et al. | 28/25.01 |
| 5,298,587 A | 3/1994 | Hu et al. | 527/10 |
| 5,494,712 A | 2/1996 | Hu et al. | 427/489 |
| 5,591,566 A | 1/1997 | Ogawa | 430/325 |
| 5,593,741 A | 1/1997 | Ikeda | 427/579 |
| 5,598,027 A | 1/1997 | Matsuura | 257/635 |
| 5,599,740 A | 2/1997 | Jang et al. | 437/190 |
| 5,616,369 A | 4/1997 | Williams et al. | 427/536 |
| 5,618,619 A | 4/1997 | Petrmichl et al. | 428/334 |
| 5,637,351 A | 6/1997 | O'Neal et al. | 427/255.3 |
| 5,638,251 A | 6/1997 | Goel et al. | 361/313 |
| 5,641,607 A | 6/1997 | Ogawa et al. | 430/272.1 |

(Continued)

FOREIGN PATENT DOCUMENTS

| | | |
|---|---|---|
| DE | 196 54 737 A1 | 7/1997 |
| DE | 198 04 375 A1 | 1/1999 |
| DE | 199 04 311 A1 | 8/1999 |
| EP | 0 771 886 A1 | 5/1997 |
| EP | 0 774 533 A1 | 5/1997 |

(Continued)

OTHER PUBLICATIONS

U.S. patent application 10/375,852 filed on Feb. 25, 2003.
U.S. patent application 10/122,106 filed on Apr. 11, 2002.
U.S. patent application 09/627,667 filed on Jul. 28, 2000.
U.S. application 10/196,498 filed on Jul. 15, 2002 (AMAT/6084).
U.S. application 10/247,404 filed on Jun. 19, 2002 (AMAT/6084.P1).
U.S. application 10/096,503 filed on Mar. 12, 2002 (AMAT/6084.02).

(Continued)

*Primary Examiner*—David Nelms
*Assistant Examiner*—Renee R. Berry
(74) *Attorney, Agent, or Firm*—Patterson & Sheridan

(57) ABSTRACT

Methods are provided for depositing a dielectric material. The dielectric material may be used for an anti-reflective coating or as a hardmask. In one aspect, a method is provided for processing a substrate including introducing a processing gas comprising a silane-based compound and an organosilicon compound to the processing chamber and reacting the processing gas to deposit a nitrogen-free dielectric material on the substrate. The dielectric material comprises silicon and oxygen.

37 Claims, 6 Drawing Sheets

U.S. PATENT DOCUMENTS

| | | | |
|---|---|---|---|
| 5,679,413 A | 10/1997 | Petrmichl et al. | 427/534 |
| 5,683,940 A | 11/1997 | Yahiro | 437/195 |
| 5,693,563 A | 12/1997 | Teong | 437/190 |
| 5,700,720 A | 12/1997 | Hashimoto | 437/195 |
| 5,703,404 A | 12/1997 | Matsuura | 257/758 |
| 5,739,579 A | 4/1998 | Chiang et al. | 257/635 |
| 5,753,319 A | 5/1998 | Knapp et al. | 427/529 |
| 5,753,564 A | 5/1998 | Fukada | 437/238 |
| 5,789,319 A | 8/1998 | Havemann et al. | 438/668 |
| 5,800,877 A | 9/1998 | Maeda et al. | 427/535 |
| 5,807,785 A | 9/1998 | Ravi | 438/624 |
| 5,821,168 A | 10/1998 | Jain | 438/692 |
| 5,834,162 A | 11/1998 | Malba | 430/317 |
| 5,858,880 A | 1/1999 | Dobson et al. | 438/758 |
| 5,874,367 A | 2/1999 | Dobson | 438/787 |
| 5,888,593 A | 3/1999 | Petrmichl et al. | 427/563 |
| 5,891,799 A | 4/1999 | Tsui | 438/624 |
| 5,989,998 A | 11/1999 | Sugahara et al. | 438/623 |
| 6,037,274 A | 3/2000 | Kudo et al. | 438/778 |
| 6,051,321 A | 4/2000 | Lee et al. | 438/447 |
| 6,054,206 A | 4/2000 | Mountsier | 428/312.8 |
| 6,054,379 A | 4/2000 | Yau et al. | 438/623 |
| 6,068,884 A | 5/2000 | Rose et al. | 427/255.6 |
| 6,072,227 A | 6/2000 | Yau et al. | 257/642 |
| 6,080,526 A | 6/2000 | Yang et al. | 430/296 |
| 6,111,698 A * | 8/2000 | Woodard et al. | 359/858 |
| 6,124,641 A | 9/2000 | Matsura | 257/759 |
| 6,140,226 A | 10/2000 | Grill et al. | 438/637 |
| 6,147,009 A | 11/2000 | Grill et al. | 438/780 |
| 6,156,874 A | 12/2000 | Hu et al. | |
| 6,159,871 A | 12/2000 | Loboda et al. | 438/786 |
| 6,176,198 B1 | 1/2001 | Kao et al. | 118/723 |
| 6,238,751 B1 | 5/2001 | Mountsier | 427/574 |
| 6,245,690 B1 | 6/2001 | Yau et al. | 438/780 |
| 6,252,295 B1 | 6/2001 | Cote et al. | |
| 6,258,735 B1 | 7/2001 | Xia et al. | 438/788 |
| 6,287,990 B1 | 9/2001 | Cheung et al. | 438/780 |
| 6,303,523 B1 | 10/2001 | Cheung et al. | 438/780 |
| 6,312,793 B1 | 11/2001 | Grill et al. | 428/312.6 |
| 6,316,063 B1 | 11/2001 | Andideh et al. | 427/577 |
| 6,340,435 B1 | 1/2002 | Bjorkman et al. | 216/72 |
| 6,340,628 B1 | 1/2002 | Van Cleemput et al. | 438/586 |
| 6,340,629 B1 | 1/2002 | Yeo et al. | |
| 6,348,421 B1 | 2/2002 | Shu et al. | 438/788 |
| 6,348,725 B1 | 2/2002 | Cheung et al. | 257/642 |
| 6,368,924 B1 | 4/2002 | Mancini et al. | 438/286 |
| 6,383,955 B1 | 5/2002 | Matsuki et al. | 438/790 |
| 6,410,462 B1 | 6/2002 | Yang et al. | 438/788 |
| 6,410,463 B1 | 6/2002 | Matsuki | 438/790 |
| 6,413,583 B1 | 7/2002 | Moghadam et al. | 427/249.15 |
| 6,417,098 B1 | 7/2002 | Wong et al. | 438/638 |
| 6,432,417 B1 | 8/2002 | Mellul et al. | 424/401 |
| 6,437,443 B1 | 8/2002 | Grill et al. | 257/758 |
| 6,441,491 B1 | 8/2002 | Grill et al. | 257/759 |
| 6,448,176 B1 | 9/2002 | Grill et al. | 438/637 |
| 6,448,186 B1 | 9/2002 | Olson et al. | 438/758 |
| 6,455,445 B1 | 9/2002 | Matsuki | 438/786 |
| 6,458,720 B1 | 10/2002 | Aoi | 438/781 |
| 6,462,371 B1 | 10/2002 | Weimer et al. | 257/306 |
| 6,472,231 B1 | 10/2002 | Gabriel et al. | 438/9 |
| 6,472,264 B1 * | 10/2002 | Agarwal | 438/238 |
| 6,472,317 B1 | 10/2002 | Wang et al. | 438/638 |
| 6,479,110 B1 | 11/2002 | Grill et al. | 427/577 |
| 6,479,407 B1 | 11/2002 | Yokoyama et al. | 438/788 |
| 6,479,408 B1 | 11/2002 | Shioya et al. | 438/789 |
| 6,479,409 B1 | 11/2002 | Shioya et al. | 438/790 |
| 6,482,731 B1 | 11/2002 | Juengling | |
| 6,482,754 B1 | 11/2002 | Andideh et al. | 438/780 |
| 6,485,815 B1 | 11/2002 | Jeong et al. | 428/210 |
| 6,489,233 B1 | 12/2002 | Chooi et al. | 438/637 |
| 6,492,731 B1 | 12/2002 | Catabay et al. | 257/758 |
| 6,497,963 B1 | 12/2002 | Grill et al. | 428/446 |
| 6,500,772 B1 | 12/2002 | Chakravarti et al. | 438/789 |
| 6,500,773 B1 | 12/2002 | Gaillard et al. | |
| 6,511,903 B1 | 1/2003 | Yau et al. | 438/623 |
| 6,511,909 B1 | 1/2003 | Yau et al. | 438/638 |
| 6,514,667 B1 | 2/2003 | Angelopoulos et al. | 430/271.1 |
| 6,541,397 B1 * | 4/2003 | Bencher | 438/780 |
| 6,720,251 B1 | 4/2004 | Van Schravendijk et al. | |
| 6,727,456 B1 * | 4/2004 | Yasuno et al. | 219/121.47 |
| 2001/0004479 A1 | 6/2001 | Cheung et al. | 427/553 |
| 2001/0005546 A1 | 6/2001 | Cheung et al. | 428/210 |
| 2001/0021590 A1 | 9/2001 | Matsuki | 438/780 |
| 2002/0055672 A1 | 5/2002 | Zhang | 600/322 |
| 2002/0068458 A1 | 6/2002 | Chiang et al. | 438/694 |
| 2002/0076944 A1 | 6/2002 | Wang et al. | 438/780 |
| 2002/0098684 A1 | 7/2002 | Li et al. | 438/630 |
| 2002/0098714 A1 | 7/2002 | Grill et al. | 438/778 |
| 2002/0105084 A1 | 8/2002 | Li | 257/759 |
| 2002/0160604 A1 | 10/2002 | Quek et al. | 438/689 |
| 2002/0160626 A1 | 10/2002 | Matsuki et al. | 438/780 |
| 2002/0164891 A1 | 11/2002 | Gates et al. | 438/780 |
| 2002/0168870 A1 | 11/2002 | Matsuki | 438/778 |
| 2002/0172768 A1 | 11/2002 | Laxman et al. | |
| 2002/0173157 A1 | 11/2002 | Chang et al. | 438/700 |
| 2002/0173172 A1 | 11/2002 | Loboda et al. | 438/786 |
| 2002/0177303 A1 | 11/2002 | Jiang et al. | 438/653 |
| 2002/0177329 A1 | 11/2002 | Yang et al. | 438/798 |
| 2002/0185741 A1 | 12/2002 | Babich et al. | 257/759 |
| 2002/0192982 A1 | 12/2002 | Anidideh et al. | 438/780 |
| 2002/0198353 A1 | 12/2002 | Chen et al. | 528/10 |
| 2003/0001239 A1 | 1/2003 | Gallahger et al. | 257/632 |
| 2003/0003765 A1 | 1/2003 | Gibson, Jr. et al. | 438/760 |
| 2003/0017718 A1 | 1/2003 | Aoi | 438/778 |
| 2003/0020108 A1 | 1/2003 | Weimer et al. | 257/296 |
| 2003/0064154 A1 | 4/2003 | Laxman et al. | |
| 2003/0089988 A1 | 5/2003 | Matsuura | 257/758 |
| 2003/0111730 A1 | 6/2003 | Takeda et al. | 257/758 |

FOREIGN PATENT DOCUMENTS

| | | |
|---|---|---|
| EP | 0 826 791 A2 | 3/1998 |
| EP | 0 840 365 A2 | 6/1998 |
| EP | 0 849 789 A2 | 6/1998 |
| EP | 0 885 983 A1 | 12/1998 |
| EP | 0 926 715 A2 | 6/1999 |
| EP | 0 926 724 A2 | 6/1999 |
| EP | 0 935 283 A2 | 8/1999 |
| EP | 0 960 958 A2 | 12/1999 |
| EP | 1 037 275 A1 | 9/2000 |
| EP | 1 061 158 A2 | 12/2000 |
| EP | 1 123 991 A2 | 8/2001 |
| EP | 1 176 226 A1 | 1/2002 |
| EP | 1 209 728 A2 | 5/2002 |
| GB | 2 316 535 | 2/1998 |
| JP | 01-125193 | 5/1989 |
| JP | 09-008031 | 1/1997 |
| JP | 09-64029 | 3/1997 |
| JP | 09-237785 | 9/1997 |
| JP | 09-251997 | 9/1997 |
| JP | 09-260369 | 10/1997 |
| JP | 10/242143 | 9/1998 |
| JP | 11-251293 | 9/1999 |
| WO | 98/08249 | 2/1998 |
| WO | 98/59089 | 12/1998 |
| WO | 99/38202 | 7/1999 |
| WO | 99/55526 | 11/1999 |
| WO | 00/01012 | 1/2000 |
| WO | 00/19498 | 4/2000 |
| WO | 00/24050 | 4/2000 |
| WO | 01/01472 | 1/2001 |
| WO | 02/43119 | 5/2002 |

OTHER PUBLICATIONS

PCT/International Search Report for US/02/40034 dated May 19, 2003.

Wu, et al "Advanced Metal Barrier Free Cu Damascene Interconnects with PECVD Silicon Carbide Barriers for 90/65–nm BEOL Technology", 2002 IEEE, IEDM pp. 595–598.

Robles, et al. Characterization of High Density Plasma Chemical Vapor Deposited x–Carbon and X–Fluorinated Carbon Films for Ultra Low Dielectric Application, Feb. 10–11, 1997 DUMIC Conference, pp. 26–33.

Bar–Ilan, et al. A Comparative Study of Sub–Micro Gap Filling and Planarization Techniques, Tower Semiconductor Ltd., Israel, SPIE vol. 2636, pp. 277–288.

Hazari, et al., Characterization of Alternative Chemistries for Depositing PECVD Silicon Dioxide Films, Novellus Systems, Inc., San Jose, CA Feb. 16–17, 1998, pp. 319–326.

McClatchie, Low Dielectric Constant Oxide Films Deposited Using CVD Techniques, Feb. 16–17, 1998 DUMIC Conference, pp. 311–318.

Reif, et al., Environmental, Safety, and Health Issues in IC Production, Mat. Res. Soc. Symposium Proceedings vol. 447, Dec. 4–5, 1996 (6 pages).

Laboda, et al., Deposition of Low–k Dielectric Films Using Trimethylsilane, Electro. Chem. Soc., vol. 98–6, pp. 145–152.

Zhao, et al., Integration of Low Dielectric Constant Materials in Advanced Aluminum and Copper Interconnects, Conexant Systems, 1999 pp. 485–497.

Sugahara, et al., Low Dielectric Constant Carbon Containing $SiO_2$ Films Deposited by PECVD Technique Using a Novel CVD Precursor, Feb. 10–11, 1997 DUMIC Conference, pp. 19–25.

Nara, et al., Low Dielectric Constant Insulator Formed by Downstream Plasma CVD at Room Temperature Using $TMS/0_2$, ULSI Research Lab, Nov. 14, 1996, pp. 1477–1480.

Deen, et al. Silicon Nitride and Silicon Dioxide Thin Insulating Films, Dielectric Science and Technology and Electronics Divisions Proceedings, vol. 97–10, pp. 443–453.

Brown, Dielectric Material Integration for Microelectronics, Dielectric Science and Technology and Electronics Divisions Proceedings, vol. 98–3 (8 pages).

Grill, et al., Novel Low–k Dielectrics Based on Diamondlike Carbon Materials, IBM Research Division, pp. 1649–1653.

Lin, et al., Plasma Polymerization of Trimethylsilane in Cascade Arc Discharge, Dept. of Chem. Engineering and Center for Surface Science and Plasma Technology, University of Missouri–Columbia, Feb. 4, 1997, pp. 1653–1665.

Peters, Pursuing the Perfect Low–K Dielectric, 64 Semiconductor International, Sep. 1998, (7 pages).

Grill, et al., Low Dielectric Constant Films Prepared by Plasma–enhanced Chemical Vapor Deposition from Tetramethylsilane, IBM Research Division, pp. 3314–3318.

Wrobel, et al. Reactivity of Alkylsilanes and Alkylcarbosilanes in Atomic Hydrogen–induced Chemical Vapor Deposition, Polish Academy of Sciences, Centre of Molecular and Macromolecular Studies, pp. 1060–1065.

Mahorowala, et al., Tunable Anti–Reflective Coatings with Built–in Hard Mask Properties Facilitating Thin Resist Processing, Proceedings of SPIE, vol. 4343 (2001) pp. 306–316.

Singer (editor), Anti–Reflective Coatings: A Story of Interfaces, Semiconductor International, Mar. 1999.

Taylor, et al., Parylene Copolymers, Texas Instruments, Inc., 1997, pp. 1–9.

Grill, et al., Diamondlike Carbon Materials as Low–k Dielectrics, Mat. Res. Soc., 1997, pp. 417–423.

PCT International Search Report PCT/US 03/39270, dated May 3, 2004 (AMAT/6826.PC.02)

* cited by examiner

NITROGEN-FREE DIELECTRIC ANTI-REFLECTIVE COATING AND HARDMASK

BACKGROUND OF THE DISCLOSURE

1. Field of the Invention

The invention relates to the fabrication of integrated circuits and to a process for depositing dielectric layers on a substrate and the structures formed by the dielectric layers.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional CVD processes supply reactive gases to the substrate surface where heat-induced or energy-enhanced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to reduce the capacitive coupling between adjacent metal lines. One such low k material comprises silicon, oxygen, and carbon, and may be deposited as a dielectric material in fabricating damascene features. One conductive material having a low resistivity is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e., vias, and horizontal interconnects, i.e., lines. Conductive materials, such as copper and barrier layer materials used to prevent diffusion of copper into the surrounding low k dielectric are then inlaid into the etched pattern. Any excess copper and barrier layer materials external to the etched pattern, such as on the field of the substrate, are then removed.

However, low k dielectric materials are often porous and susceptible to interlayer diffusion of conductive materials, such as copper, which can result in the formation of short-circuits and device failure. A dielectric barrier layer material is used in copper damascene structures to reduce or to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Additionally, forming damascene structures require the use of lithographic processes. For example, in process sequences using conventional lithographic techniques, a layer of energy sensitive resist is formed over a stack of material layers on a substrate. Many of these underlying material layers are reflective to ultraviolet light. Such reflections can distort the dimensions of features such as lines and vias that are formed in the energy sensitive resist material. One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

However, conventional ARC materials contain nitrogen, for example silicon nitride and titanium nitride. Nitrogen in the ARC layer may chemically alter the composition of the photoresist material. The chemical reaction between nitrogen and the photoresist material is referred to as photoresist poisoning. The altered photoresist material may not be lithographically patterned as expected and result in imprecisely formed features in the photoresist material or excessive photoresist residue remaining on the substrate surface after photoresist patterning, both of which can detrimentally affect subsequent processes, such as etching processes. For example, nitrogen may neutralize acid near a photoresist and ARC interface and result in residue formation, known as footing, which can further result in curved or rounded aspects at the interface of the bottoms and sidewalls of features rather than desired right angles.

Additionally, low k materials are susceptible to surface defects or feature deformation during polishing and removal of conductive materials under conventional polishing processes. One solution to limiting or reducing surface defects and deformation is to deposit a hardmask over the exposed low k materials prior to patterning and etching feature definitions in the low k materials. The hardmask is resistant to damage and deformation, and protects the underlying low k materials during subsequent material deposition and planarization or material removal processes, such as chemical mechanical polishing techniques or etching techniques, to reduce defect formation and feature deformation.

One difficulty when using hardmasks is that conventional hardmask materials do not have sufficient selectivity to oxide or metal during polishing, which may result in premature removal of the hardmask and expose the underlying material to the process. The exposed underlying material, such as the low k dielectric material, may be damaged and result in surface defects and feature deformation. Additionally, hardmasks, as well as ARC materials, may remain as part of the structure after the underlying dielectric layer is etched and contribute to the structure's overall dielectric constant. Conventional hardmask materials often have high dielectric constants of 7 or greater, which can produce dielectric stacks having a higher than desired dielectric constant. Current hardmask materials have not satisfactorily produced both low k material and sufficient polishing selectivity to be used in damascene fabrication.

Additionally hardmask and ARC material formed from conventional material have exhibited the formation of a porous surface containing a plurality of small holes. The small holes are referred to as pinholes. The pinholes can be formed completely through the ARC layer thereby exposing photoresist material deposited on the ARC layer to material underlying the ARC layer, such as silicon nitride. Nitrogen, for example, from silicon nitride, may diffuse through the ARC layer and chemically alter the composition of the photoresist material and result in photoresist poisoning.

Therefore, there remains a need for an improved process and material for forming dielectric materials suitable as anti-reflective coatings or hardmasks with a satisfactory etching selectivity for damascene applications.

SUMMARY OF THE INVENTION

Aspects of the invention generally provide a method for depositing a nitrogen-free dielectric layer for use as a hardmask or anti-reflective coating. In one aspect, the invention provides a method for processing a substrate including introducing a processing gas comprising an oxygen-free silane-based compound and an oxygen-containing organosilicon compound to the processing chamber and reacting the processing gas to deposit a nitrogen-free dielectric material on the substrate, wherein the dielectric material comprises silicon and oxygen.

In another aspect of the invention, a method is provided for processing a substrate including depositing an anti-reflective coating on a dielectric layer by reacting a processing gas comprising an oxygen-free silane-based compound and an oxygen-containing organosilicon compound to deposit a nitrogen-free dielectric material on the substrate, wherein the anti-reflective coating comprises silicon and oxygen, depositing a photoresist material on the anti-reflective coating, and patterning the photoresist layer.

In another aspect of the invention, a method is provided for processing a substrate including depositing at least one dielectric layer on a substrate surface, forming a hardmask layer on the at least one organic or inorganic layer, wherein the hardmask layer is deposited by a process comprising reacting a processing gas comprising an oxygen-free silane-based compound and an oxygen-containing organosilicon compound to deposit a nitrogen-free dielectric material on the substrate, wherein the hardmask layer comprises silicon and oxygen and has a selectivity of oxide to hardmask of about 4:1 or greater, defining a pattern in at least one region of the hardmask layer, and forming a feature definition in the at least one organic or inorganic layer by the pattern formed in the at least one region of the hardmask layer.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
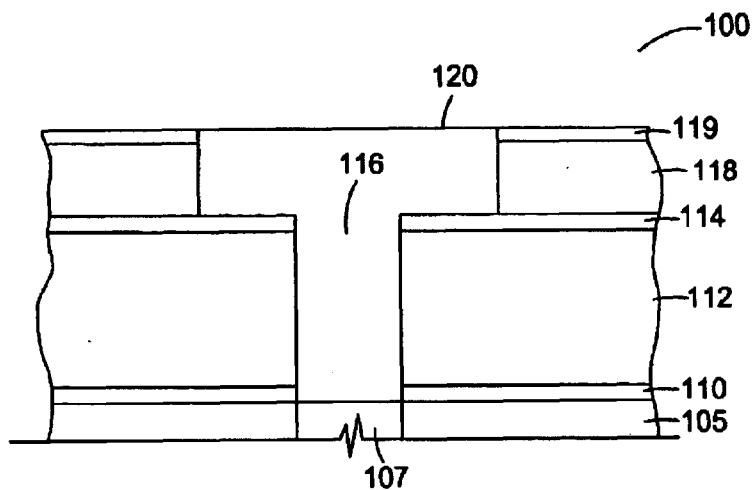
FIG. 1 is a cross sectional view showing a dual damascene structure comprising a low k barrier layer and a low k dielectric layer described herein.

For a further understanding of aspects of the invention, reference should be made to the ensuing detailed description.

DETAILED DESCRIPTION OF THE PREFERRED EMBODIMENTS

Aspects of the invention described herein refer to method for depositing a nitrogen-free dielectric material. The nitrogen-free dielectric material may be used as an anti-reflective coating adjacent a dielectric material or a hardmask dielectric layer in a metallization scheme for a damascene or dual damascene process.

In one aspect, the nitrogen-free dielectric material may be deposited by reacting a processing gas comprising a silane-based compound and an organosilicon compound. The nitrogen-free dielectric material, comprises at least silicon and oxygen, a silicon oxide material, and may further include carbon, a carbon-doped silicon oxide. The nitrogen-free dielectric material may be deposited by a plasma-enhanced chemical vapor deposition process. The deposited nitrogen-free dielectric material may exhibit a dielectric constant of about 11 or less, such as about 4 or less.

Suitable silane-based compounds for the processes described herein include oxygen-free silane-based compounds. Oxygen-free silane-based compounds having the formula $Si_xH_{2X+2}$, $Si_xCl_{2X+2}$, $(CH_3)_xSiH_y$, or combinations thereof, with X being 1 to 4 and Y is equal to 4 minus X, may be used in the deposition processes described herein. Examples of such compounds include silane, disilane, chlorosilane, dichlorodisilane, hexachlorosilane, methylsilane, dimethylsilane, trimethylsilane, tetramethylsilane, and combinations thereof may also be used. One or more of the oxygen-free silane-based compounds may be used in the deposition processes described herein. The silane-based compound, such as silane, may be supplied to a plasma processing chamber at a flow rate between about 100 sccm and about 700 sccm.

Suitable organosilicon compounds include oxygen-containing organosilicon compounds. For example, suitable oxygen-containing organosilicon compounds include tetraethoxysilane (TEOS), triethoxyfluorosilane (TEFS), 1,3,5,7-tetramethylcyclotetrasiloxane (TMCTS), dimethyldiethoxy (DMDE) silane, and combinations thereof, may be used in the processing gas. Other suitable organosilicon compounds include dimethyldimethoxysilane, 1,3-dimethyldisiloxane, 1,1,3,3-tetramethyldisiloxane (TMDSO), hexamethyldisiloxane (HMDS), 1,3-bis(silanomethylene)disiloxane, bis(1-methyldisiloxanyl)methane, 2,2-bis(1-methyldisiloxanyl)propane, hexamethoxydisiloxane (HMDOS), 1,3,5-trisilano-2,4,6-trimethylene, octamethylcyclotetrasiloxane (OMCTS), 2,4,6,8,10-pentamethylcyclopentasiloxane, 1,3,5,7-tetrasilano-2,6-dioxy-4,8-dimethylene, hexamethylcyclotrisiloxane, and combinations thereof.

The organosilicon compounds are used to provide a source of oxygen and carbon for the deposited nitrogen-free dielectric material. The oxygen-containing organosilicon compound, such as TEOS, may be supplied to the plasma processing chamber at a flow rate of about 2000 mgm or greater. The oxygen-free silane-based compounds and the organosilicon compounds are generally supplied to the processing chamber in a flow rate ratio of the oxygen-free silane-based compound to the oxygen-containing organosilicon compound between about 1 (sccm):20 (mgm) and about 6 (sccm):5 (mgm).

Other materials that may provide oxygen and carbon sources, such as carbon monoxide and carbon dioxide, may be used with the organosilicon compounds, or used as an alternative to the organosilicon compounds.

If oxygen-containing organosilicon compounds are reacted to deposit the nitrogen-free dielectric material, the nitrogen-free dielectric material has an oxygen content between about 15 atomic % and about 50 atomic %, for example, between about 15 atomic % and about 30 atomic % to have sufficient layer properties to perform an anti-reflective coating and/or hardmask layer. The silicon content of the deposited film may contain between about 20 atomic % and about 50 atomic %, between about 20 and about 30 atomic % of hydrogen, and generally less than about 15 atomic % of carbon. The film is generally considered a carbon-doped silicon oxide at the respective silicon, oxygen, and carbon contents described herein.

The amount of oxygen, silicon, and carbon content of the deposited film may vary on the processing conditions. For example, increasing silane-base precursor flow rates have been observed to result in reducing the oxygen content of the deposited materials.

The processing gas may further comprise an inert gas. Inert gases, such as a noble gas selected from the group of argon, helium, neon, xenon, or krypton, and combinations thereof, may be added to the processing gas to improve processing stability. The inert gas may be provided at a flow rate between about 100 sccm and about 20,000 sccm.

The processes described herein are preferably performed in a processing chamber adapted to chemically mechanically deposit organosilicon material while applying RF power, such as a DxZ™ chemical vapor deposition chamber or the Producer™ deposition chamber, both of which are commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

A nitrogen-free dielectric material may be deposited in one embodiment by supplying the silane-based compound, such as silane, to a plasma processing chamber at a flow rate between about 100 sccm and about 700 sccm, supplying the oxygen-containing organosilicon compound, such as TEOS, to the plasma processing chamber at a flow rate of about 2000 mgm or greater, supplying a noble gas at a flow rate between about 100 sccm and about 20,000 sccm, maintaining a substrate temperature between about 100° C. and about 1000° C., maintaining a chamber pressure below about 50 Torr and an RF power of between about 0.16 watts/cm$^2$ and about 32 watts/cm$^2$, or a power level between about 50 watts and about 10,000 watts for a 200 mm substrate. The substrate is maintained at a distance between about 0.1 cm and about 10 cm from the source of the processing gas.

The RF power can be provided at a frequency between about 1 kHz and about 10 GHz. In one aspect, the RF power can be provided at a high frequency such as between about 13 MHz and about 14 MHz or a mixed frequency of the high frequency and the low frequency, for example, a high frequency of about 13.56 MHz and a low frequency of about 356 KHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface.

In one preferred aspect, a nitrogen-free dielectric material may be deposited in one embodiment by supplying silane to a plasma processing chamber at a flow rate between about 100 sccm and about 700 sccm, supplying TEOS to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

The above process parameters provide a deposition rate for the nitrogen-free dielectric material in the range of about 500 Å/min to about 20,000 Å/min, such at about 2000 Å/min, when implemented on a 200 mm (millimeter) substrate in a deposition chamber available from Applied Materials, Inc., Santa Clara, Calif.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. Annealing is preferably performed after the deposition of a subsequent layer to reduce or minimize any shrinkage or deformation of the dielectric layer that may occur during annealing. Inert gases, such as argon and helium, may be added to the annealing atmosphere.

The deposited nitrogen-free dielectric material may be plasma treated to remove contaminants or otherwise clean the exposed surface of the nitrogen-free dielectric layer prior to subsequent deposition of materials thereon. The plasma treatment may be performed in the same chamber used to deposit the nitrogen-free dielectric material. The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The plasma treatment may be performed between about 10 seconds and about 100 seconds. The plasma treatment is believed to clean contaminants from the exposed surface of the nitrogen-free dielectric material and may be used to stabilize the layer, such that it becomes less reactive with moisture and/or oxygen under atmospheric condition as well as the adhesion of layers formed thereover.

However, it should be noted that the respective parameters might be modified to perform the plasma processes in various chambers and for different substrate sizes, such as 300 mm substrates. An example of a plasma treatment for dielectric films is further disclosed in U.S. patent application Ser. No. 09/336,525, entitled, "Plasma treatment to Enhance adhesion and to Minimize Oxidation of Carbon-Containing Layers," filed on Jun. 18, 1999, and in co-pending U.S. patent application Ser. No. 10/122,106, filed on Apr. 11, 2002, entitled, "Methods for Depositing Dielectric Materials", both of which are incorporated herein by reference to the extent not inconsistent with the claimed aspects and description herein.

The deposited nitrogen-free dielectric material may have a light absorption coefficient, or extinction coefficient ($\kappa$), that can be varied between about 0 to about 2.0, such as between about 0 and about 1.5, for example between about 0.1 and about 1.1, at wavelengths below about 250 nm (nanometers), such as about 248 nm wavelengths or 193 nm wavelengths, making it suitable for use as an anti-reflective coating (ARC) at deep ultraviolet (DUV) wavelengths. The $\kappa$ value represents the amount of absorption of light passing therethrough. As the $\kappa$ value increases, the amount of light absorption increases. A material having a $\kappa$ value of greater than about 0.5 has been observed to be effective for use as a hardmask and $\kappa$ values between about 0 and about 2 may be used for ARC applications depending upon the requirements for use of the ARC layer.

The nitrogen-free dielectric material also has an index of refraction (n), which represents the refraction of the light passing therethrough, of less than about 3 at wavelengths below about 250 nm, such as at 193 nm wavelength light. Generally, n values, such between about 1.5 and about 2.2, for example, between about 1.7 and about 2.2, are acceptable for lithographic processes at wavelengths below 250 nm (nanometers) using the hardmask and ARC layer applications described herein. The n values have been observed to generally increase with the $\kappa$ value up to about a $\kappa$ value of about 0.5. The n values are then observed to generally decrease as $\kappa$ values increase above 0.5.

The extinction coefficient ($\kappa$) and the index of refraction (n) of the nitrogen-free dielectric material may be varied as a function of the composition of the gas mixture and processing parameters. It is believed that the amount of Si—H bonds in the deposited material affects the absorption coefficient ($\kappa$), and that modification of compositions and processing parameters will allow for control of the amount of Si—H bonds and the optical properties of the deposited material.

It has been observed that increasing the silicon concentration in the deposited material results in increased Si—H bonds in the deposited material and increased $\kappa$ values of the deposited material. In contrast, the increase in the oxygen content of the deposited material results in a decreased $\kappa$ value. Increasing the carbon concentration of the deposited material has also been observed to increase the $\kappa$ value.

For example, as the concentration of the silane-source gas is increased, i.e., the ratio of silane to TEOS increases, the amount of Si—H bonds and the extinction coefficient ($\kappa$) of the deposited material is observed to increase. For example, as the silane flow rate increases from about 50 to about sccm 225 sccm at a constant TEOS flow rate of about 500 mgm, the K value increases from about 0.3 to about 0.9 when all other values are held constant. In another example, as the silane flow rate increases from about 150 sccm to about 550 sccm at a constant TEOS flow rate of 2000 mgm, the $\kappa$ value increases from about 0.275 to about 0.625 when all other values are held constant. Increasing the silane-based precursor flow rates have been observed to result in reducing the oxygen content of the deposited materials.

The index of refraction (n) may also be controlled by controlling the ratio of silane to TEOS. For example, a silane flow rate between about 50 sccm and about 250 sccm at a 500 mgm flow rate of TEOS can control the n value between about 1.9 and about 2.05, while a silane flow rate between about 150 sccm and about 550 sccm at a 2000 mgm flow rate of TEOS can control the n value between about 1.85 and about 1.7 respectively.

The $\kappa$ values and n values may also be controlled by power levels and pressures. For example, increasing power has been generally observed in increasing the oxygen content of deposited material and increasing the $\kappa$ value. Additionally, increasing deposition pressure has also been observed to result in lower $\kappa$ values.

The nitrogen-free dielectric material is suitable for deposition on organic materials, such as dielectric silicon carbide or silicon oxycarbide films, or inorganic materials, such as polysilicon or metals materials including copper or barrier materials, such as tantalum. The embodiments described herein for depositing nitrogen-free dielectric material are provided to illustrate the invention and particular embodiments, and should not be used to limit the scope of the invention.

Deposition of an ARC Layer for a Dual Damascene Structure

An example of a damascene structure that is formed using the nitrogen-free dielectric material described herein as a barrier layer is shown in FIG. 1. A barrier layer 110, such as silicon carbide or oxygen-doped silicon carbide may be deposited to reduce or minimize interlayer diffusion of material. An example of a silicon carbide deposition process is described in co-pending U.S. patent application Ser. No. 09/165,248, filed on Oct. 1, 1998, entitled, "Silicon Carbide Deposition As A Barrier Layer And An Etch Stop", and in co-pending U.S. patent application Ser. No. 10/122,106, filed on Apr. 11, 2002, entitled, "Methods for Depositing Dielectric Materials", both of which are incorporated herein by reference to the extent not inconsistent with the claimed aspects and description herein. The substrate surface may comprise metal features 107 formed in a dielectric material 105.

A first dielectric layer 112, typically an interlayer dielectric material, such as a silicon oxycarbide material (carbon doped silicon oxide) produced by oxidizing an alkylsilane in a RF energy-enhanced chemical vapor deposition process, is deposited on the oxygen-doped silicon carbide barrier layer 110 on the substrate surface including metal features 107 formed in a dielectric material 105. An example of the dielectric material for the first dielectric layer 112 and process for deposition the dielectric material is more fully described in U.S. Pat. No. 6,287,990, issued on Sep. 11, 2001, which is incorporated by reference herein to the extent not inconsistent with the description and claims herein.

An etch stop (or second barrier layer) 114, for example, a silicon carbide material, is then deposited on the first dielectric layer 112. The etch stop 114 is then pattern etched to define the openings of the interconnects or contacts/vias 116. A second dielectric layer 118 is then deposited over the patterned etch stop. A nitrogen-free ARC layer 119 as described herein is then deposited over the second dielectric layer 118. A photoresist is then deposited and patterned by conventional means known in the art to define the contacts/via 116. A single etch process is then performed to define the contact/vias 116 down to the etch stop and to etch the unprotected dielectric exposed by the patterned etch stop to define the contacts/vias 116. One or more conductive materials 120 such as copper are then deposited to fill the formed contacts/vias 116.

A preferred dual damascene structure fabricated in accordance with the invention including a nitrogen-free ARC layer deposited by the processes described herein is sequentially depicted schematically in FIGS. 2A–2H, which are cross sectional views of a substrate having the steps of the invention formed thereon.

Figure 2A:
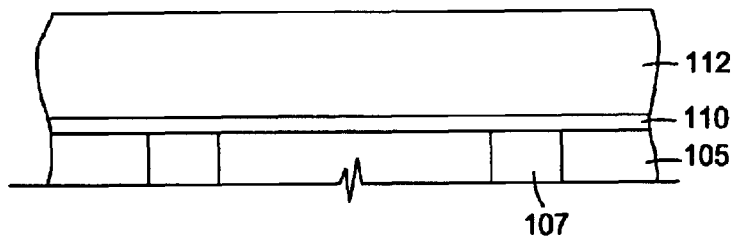
FIGS. 2A–2H are cross sectional views showing one embodiment of a dual damascene deposition sequence of the invention.

As shown in FIG. 2A, an oxygen-doped silicon carbide barrier layer 110 is deposited on the substrate surface. An example of a oxygen-doped silicon carbide deposition is as follows; introducing 1,3,5,7-tetramethylcyclotetrasiloxane (TMCTS) at about 300 mgm into the processing chamber, introducing trimethylsilane (TMS) at about 360 mgm into the processing chamber, introducing helium at about 1000 sccm into the processing chamber, generating a plasma in the processing chamber by applying 950 watts of RF energy, maintaining the substrate temperature at about 350° C., maintaining the chamber pressure at about between about 8.7 Torr to deposit an oxygen-doped silicon carbide layer. The spacing between the gas distributor and the substrate surface is about 515 mils. The above provided example is merely illustrative and should not be construed or interpreted as limiting the scope of the invention.

Further examples of depositing oxygen-doped silicon carbide material are more fully described in U.S. Provisional Patent Application Serial No. 60/340,615, filed on Dec. 14, 2001, entitled, "A Method of Depositing Dielectric Materials in Damascene Applications", which is incorporated herein by reference to the extent not inconsistent with the claimed aspects and description herein. While not shown, a capping layer of nitrogen-free silicon carbide may be deposited on the barrier layer 110. The nitrogen-free silicon carbide capping layer may be deposited in situ.

The oxygen-doped silicon carbide barrier layer 110 may be plasma treated with an inert gas including helium (He), argon (Ar), neon (Ne), and combinations thereof, and/or a reducing gas including hydrogen, ammonia, and combinations thereof. The plasma treatment may be performed in situ with the deposition of the oxygen-doped silicon carbide material.

A first dielectric layer 112 of interlayer dielectric material, such as a silicon oxycarbide, is deposited on the first oxygen-doped silicon carbide barrier layer 110 to a thickness of about 5,000 to about 15,000 Å, depending on the size of the structure to be fabricated. Example of a low dielectric constant material that may be used as an interlayer dielectric material is Black Diamond™ and Silk™ commercially available from Applied Materials, Inc., of Santa Clara, Calif. The first dielectric layer my also comprise other low k dielectric materials including a low polymer material, such as paralyne, or a low k spin-on glass such as un-doped silicon glass (USG) or fluorine-doped silicon glass (FSG).

The first dielectric layer 112 may then be treated by a plasma process to remove contaminants and densify the surface of the dielectric layer 122. An example of a plasma process includes introducing a processing gas containing helium or a reducing gas, such as hydrogen, between about 500 sccm and about 1,500 sccm, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process.

Figure 2B:
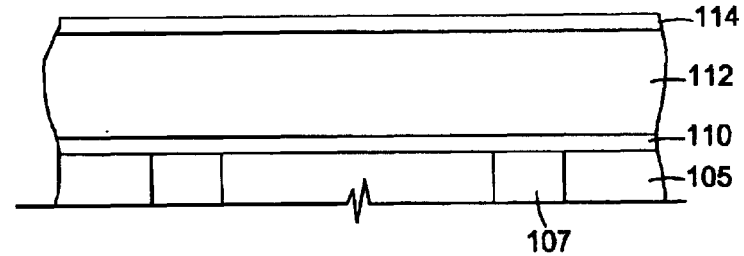
Figure 2C:
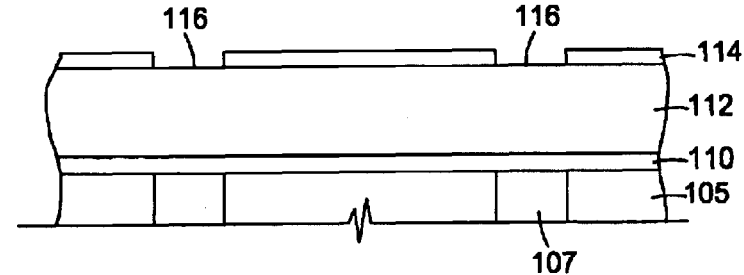

As shown in FIG. 2B, the low k etch stop 114, which may be a silicon carbide material, is then deposited on the first dielectric layer to a thickness of about 200 to about 1000 Å. The low k etch stop 114 may be plasma treated as described herein for the oxygen-doped silicon carbide barrier layer 110. The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

Figure 2D:
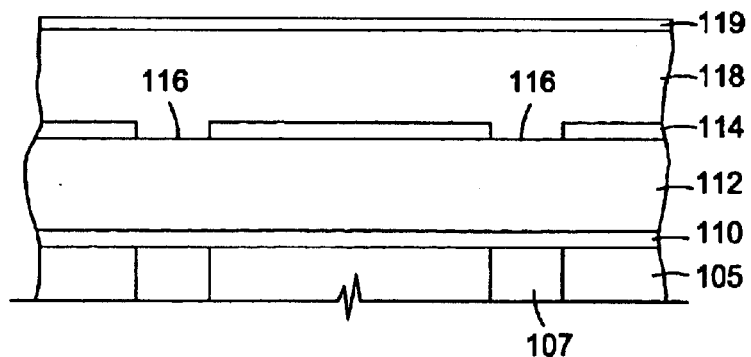

After low k etch stop 114 has been etched to pattern the contacts/vias and the photoresist has been removed, a second dielectric layer 118 of silicon oxycarbide is deposited to a thickness of about 5,000 to about 15,000 Å and a nitrogen-free ARC layer 119 is deposited thereon as shown in FIG. 2D. The second dielectric layer 118 may be plasma treated as described herein for the first dielectric layer 112 prior to depositing the nitrogen-free ARC layer 119. The plasma treatment is believed to reduce the reactivity of the surface of the layer 118 to subsequently deposited materials.

The nitrogen-free ARC layer 119 may be deposited as described herein on the second dielectric layer 118. For example, the ARC layer 110 may be deposited by supplying silane to a plasma processing chamber at a flow rate between about 100 sccm and about 700 sccm, supplying TEOS to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

In an alternative embodiment, a nitrogen-free silicon carbide or silicon oxide cap layer between about 100 Å and about 500 Å thick may be deposited on second dielectric layer 118 prior to depositing additional materials, such as the ARC layer 119.

Figure 2E:
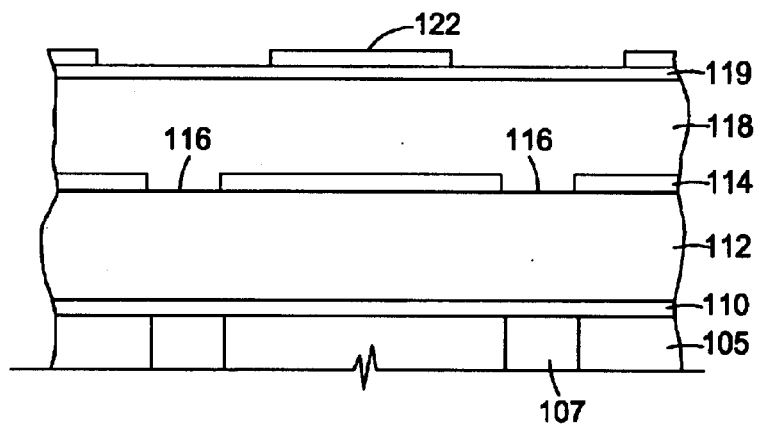
Figure 2F:
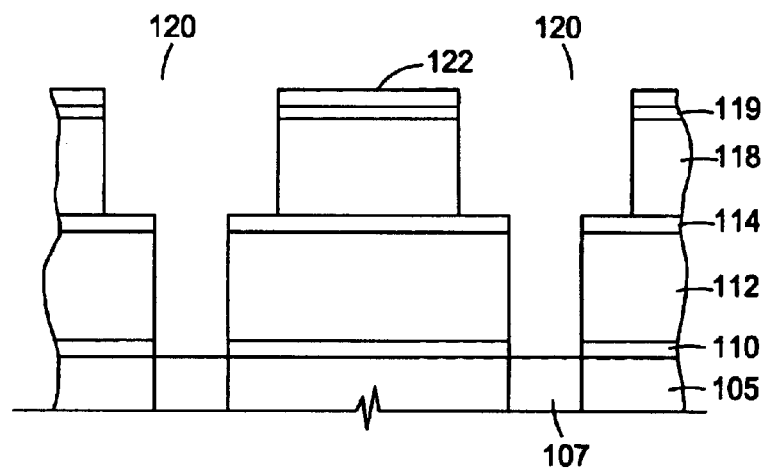

A photoresist material 122 is then deposited on the nitrogen-free ARC layer 119 and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any photoresist or other material used to pattern the etch stop 114 or the second dielectric layer 118 is removed using an oxygen strip or other suitable process.

Figure 2G:
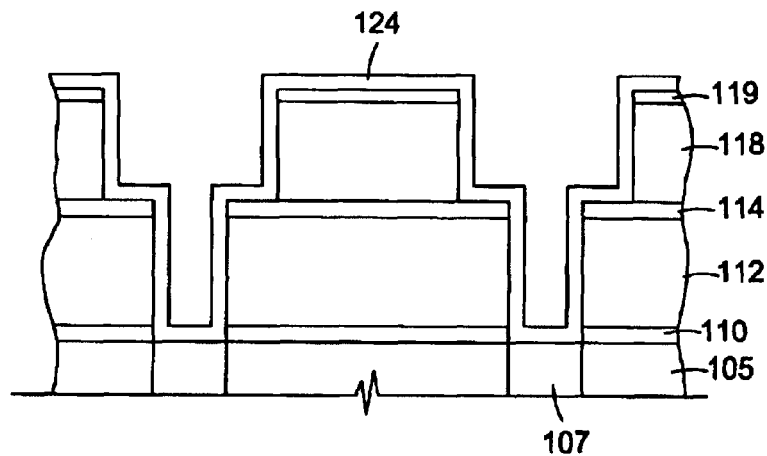
Figure 2H:
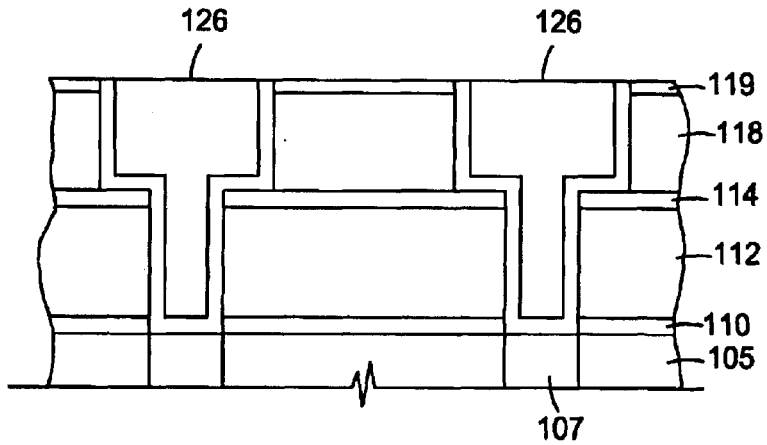

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable barrier layer 124 such as tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

Deposition of a Dual Damascene Structure

In an alternative embodiment of the damascene structure, the nitrogen-free dielectric material described herein may be deposited as a hardmask layer over a dielectric layer prior to depositing the photoresist material for improving damascene formation and protecting the k material of the damascene structure when etching the metallization structure. An example of a damascene structure that is formed using a nitrogen-free dielectric material as a hardmask described herein is shown in FIGS. 3A–G, which are cross sectional views of a substrate having the steps of the invention formed thereon.

Figure 3A:
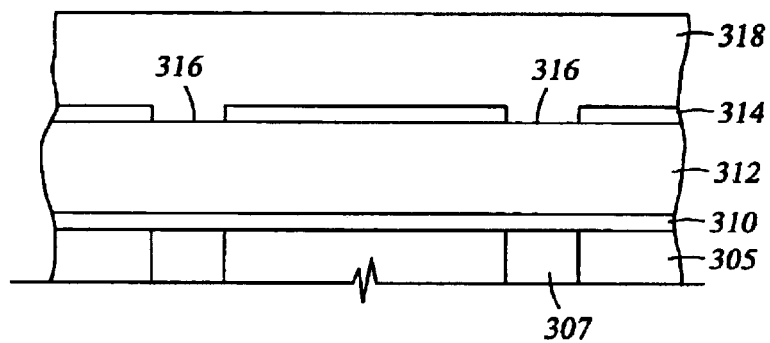
FIGS. 3A–3G are cross sectional views showing one embodiment of a dual damascene deposition sequence of the invention.

As shown in FIG. 3A, a barrier layer 310, such as silicon carbide, is deposited on the substrate surface to eliminate inter-level diffusion between the substrate and subsequently deposited material. The substrate surface may comprise feature definitions 307 formed in a dielectric material 305. The barrier layer 310 may be doped with oxygen, boron, phosphorus, or combinations thereof.

A first dielectric layer 312, which may comprise a silicon oxycarbide material is deposited on the barrier layer 310 on the substrate surface and in feature definitions 307 formed in a dielectric material 305. The first dielectric layer 312 of interlayer dielectric material is deposited on the barrier layer 310 by oxidizing an organosilane or organosiloxane, such as trimethylsilane, to a thickness of about 5,000 to about 15,000 Å, depending on the size of the structure to be fabricated.

Examples of a low dielectric constant material that may be used as an interlayer dielectric material is Black Diamond™ and Silk™ commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 312.

A low k etch stop (or second barrier layer) 314, such as a silicon carbide material or oxidized organo silane layer, is then deposited on the first dielectric layer 312 to a thickness of about 200 to about 1000 Å. The low k etch stop 314 is then pattern etched to define the contact/via openings 316 and to expose first dielectric layer 312 in the areas where the contacts/vias are to be formed as shown in FIG. 3A. Preferably, the low k etch stop 314 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 316 prior to depositing further materials.

After the low k etch stop 314 has been etched to pattern the contacts/vias and the photoresist has been removed, a second dielectric layer 318, such as silicon oxycarbide, is deposited to a thickness of about 5,000 to about 15,000 Å as shown in FIG. 3A. The second dielectric layer 318 may also be plasma treated as described herein.

Figure 3B:
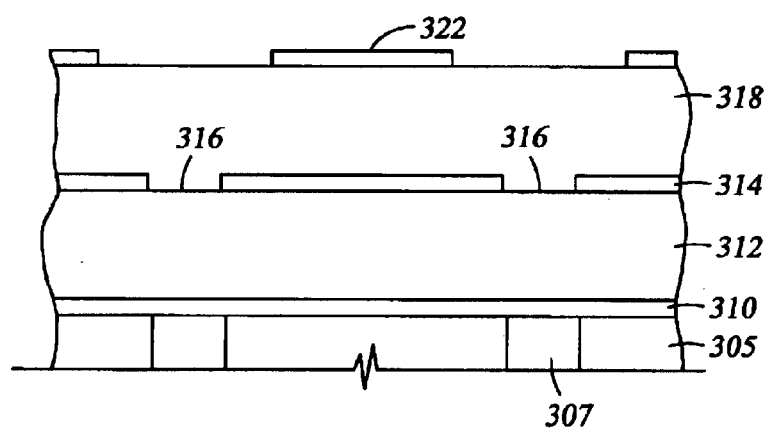

A nitrogen-free dielectric hardmask layer 322 as described herein may then be deposited on the second dielectric layer 318 and patterned preferably using conventional photolithography processes to define the interconnect lines 320 as shown in FIG. 3B. The nitrogen-free dielectric hardmask layer 322 is a hardmask which may perform as a stop for chemical mechanical polishing techniques to allow removal of conductive material while protecting low k dielectric materials, such as the second dielectric layer 318, from damage during etching processes or from polishing processes, such as chemical-mechanical polishing. The hardmask layer 322 of the nitrogen-free dielectric material described herein has exhibited an etching selectivity of oxide or metal to hardmask of about 4:1 or greater, and in some instances, has exhibited an etching selectivity of about 10:1 or greater of oxide or metal to hardmask.

The nitrogen-free dielectric hardmask layer 322 is deposited as described herein. An example of a hardmask deposition includes supplying silane to a plasma processing chamber at a flow rate between about 100 sccm and about 700 sccm, supplying TEOS to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils. The hardmask 322 is deposited at a deposition rate of about 2000 Å/min. The hardmask 322 was observed to have an etch selectivity of oxide or metal to hardmask of about 10:1.

Figure 3C:
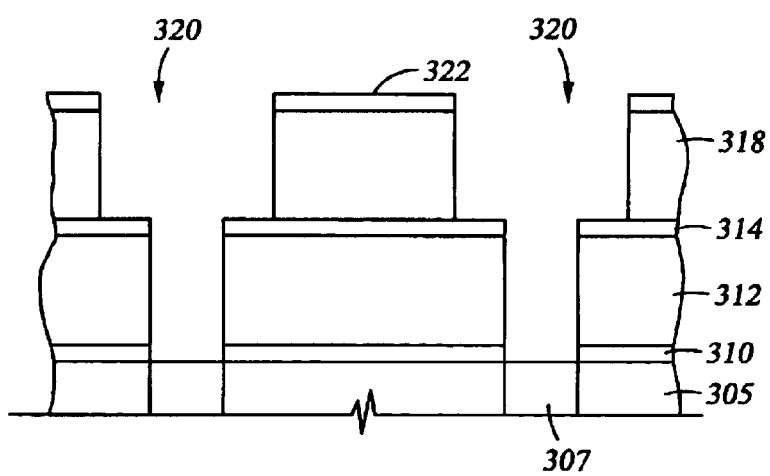

The features are then etched through to the second dielectric layer 318, the low k etch stop 314, the first dielectric layer 312, and the silicon carbide barrier layer 310 as shown in FIG. 3C. The hardmask 322 may be completely removed by the etch process.

Figure 3D:
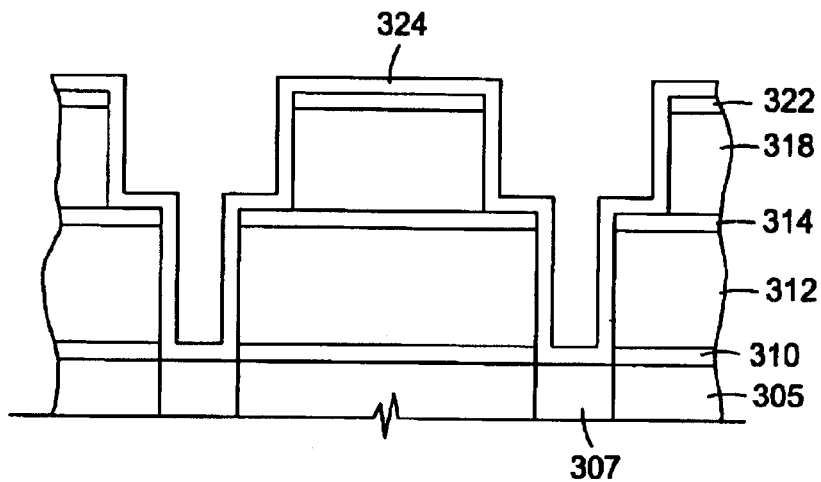
Figure 3E:
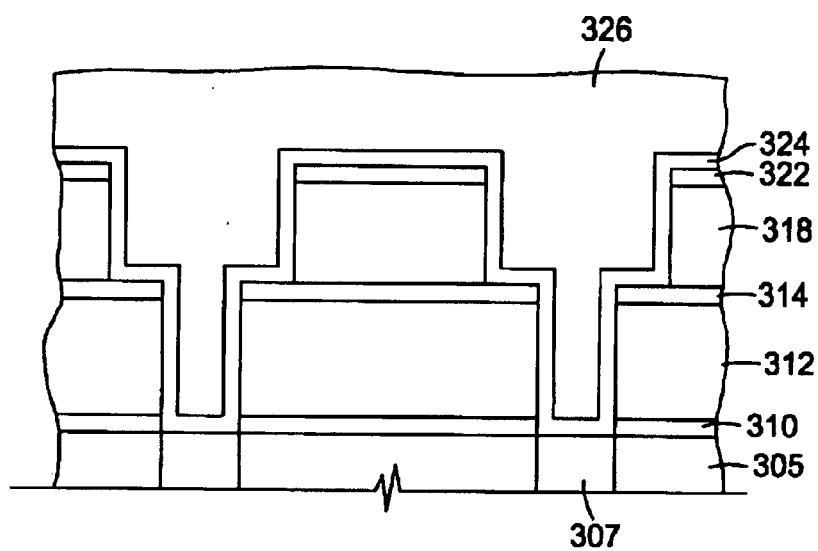

The interconnect lines 320 are then filled to form a metallization structure with a conductive material such as aluminum, copper, tungsten or combinations thereof. Presently, the trend is to use copper to form the smaller features due to the low resistivity of copper (1.7 µΩ-cm compared to 3.1 µΩ-cm for aluminum). Preferably, as shown in FIG. 3D, a suitable barrier layer 324 such as tantalum or tantalum nitride is first deposited conformally in the metallization pattern to prevent copper migration into the surrounding silicon and/or dielectric material. Thereafter, copper 326 is deposited using electrochemical deposition, such as electroplating or electroless deposition, chemical vapor deposition, physical vapor deposition, or combinations thereof, to fill the structure as shown in FIG. 3E.

Figure 3F:
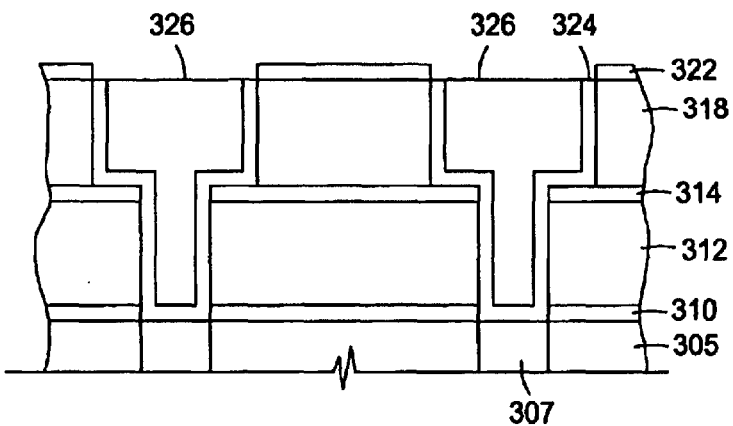
Figure 3G:
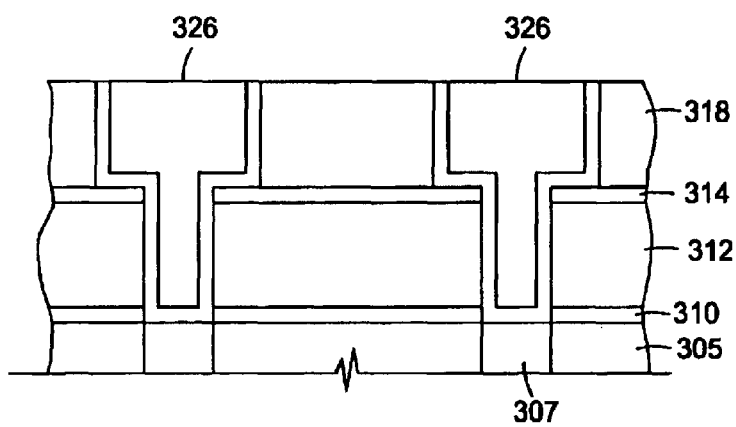

Once the structure has been filled with copper or other metal, the surface is planarized using chemical mechanical polishing. However, the polishing resistant nitrogen-free dielectric hardmask layer 322 may remain behind after the polishing process as shown in FIG. 3F. The nitrogen-free dielectric hardmask layer 322 may be removed by a plasma process from the surface of the substrate.

EXAMPLES

The following examples illustrate deposition of the materials described herein for ARC and hardmask applications. The materials were deposited using a chemical vapor deposition chamber that is part of an integrated processing platform. In particular, the films were deposited using a Producer™ deposition system commercially available from Applied Materials, Inc. of Santa Clara, Calif.

A nitrogen-free ARC layer was deposited by a mixed precursor process on a 200 mm substrate from the following reactive gases at a chamber pressure of about 5 Torr and substrate temperature of about 400° C.

Silane ($SiH_4$), at about 400 sccm;

Tetraethoxysilane (TEOS), at about 2000 mgm; and

Helium, at about 2,000 sccm;

The substrate was positioned about 400 mils from the gas distribution showerhead. A plasma was generated by applying a power level of about 500 W at a frequency of 13.56 MHz to the showerhead. The film was deposited at a rate of about 3168 Å/min for about 10 seconds for a deposition thickness of about 528 Å. The deposited film was tested and optical properties of an absorption coefficient (κ) of about 0.369 and a n value of 1.776 for a 193 nm wavelength was observed.

A nitrogen-free hardmask layer was deposited by a mixed precursor process on a 200 mm substrate from the following reactive gases at a chamber pressure of about 5 Torr and substrate temperature of about 400° C.

Silane (SiH$_4$), at about 375 sccm;

Tetraethoxysilane (TEOS), at about 1000 mgm; and

Helium, at about 2,000 sccm;

The substrate was positioned about 400 mils from the gas distribution showerhead. A plasma was generated by applying a power level of about 500 W at a frequency of 13.56 MHz to the showerhead. The film was deposited at a rate of about 3898 Å/min for about 10 seconds for a deposition thickness of about 650 Å. The deposited film was tested and optical properties of an absorption coefficient (κ) of about 1.017 and a n value of 1.774 for a 193 nm wavelength was observed.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
   introducing a processing gas comprising an oxygen-free silane-based compound and an oxygen-containing organosilicon compound to the processing chamber, wherein the oxygen-free silane-based compound has the formula Si$_x$H$_{2x+2}$ or Si$_x$Cl$_{2x+2}$ and X is 1 to 4; and
   reacting the processing gas to deposit a nitrogen-free dielectric material on the substrate, wherein the dielectric material comprises silicon and oxygen.

2. The method of claim 1, wherein the oxygen-free silane-based compound is selected from the group of silane, disilane, chlorosilane, dichlorodisilane, and combinations thereof.

3. The method of claim 1, wherein the oxygen-containing organosilicon compound is selected from the group of tetraethoxysilane (TEOS), triethoxyfluorosilane (TEFS), 1,3,5,7-tetramethylcyclotetrasiloxane (TMCTS), dimethyldiethoxy (DMDE) silane, and combinations thereof.

4. The method of claim 3, wherein the ratio of the oxygen-free silane-based compound to the oxygen-containing organosilicon compound is between about 1 sccm:20 mgm and about 6 sccm:5 mgm.

5. The method of claim 1, wherein the dielectric material comprises silicon, oxygen, and carbon, and has an oxygen content between about 15 atomic % and about 50 atomic % of oxygen.

6. The method of claim 1, wherein the processing gas further comprises an inert gas, an oxygen and carbon source, or combinations thereof, wherein the inert gas is selected from the group consisting of argon, helium, neon, xenon, krypton, and combinations thereof, and the oxygen and carbon source is selected from the group consisting of carbon monoxide, carbon dioxide, and combinations thereof.

7. The method of claim 1, wherein the deposited nitrogen-free dielectric material has an index of refraction between about 1.5 and about 2.2 and an extinction coefficient of between about 0.3 and about 0.9.

8. The method of claim 1, further comprising exposing the deposited nitrogen-free dielectric material to an annealing process or to a plasma treatment process.

9. The method of claim 8, wherein the nitrogen-free dielectric layer is a hardmask layer having a selectivity of oxide to hardmask of about 4:1 or greater.

10. The method of claim 1, wherein the reacting the processing gas comprises generating a plasma with a RF power source having a high frequency RF power capacity, a low frequency capacity, or both.

11. A method of processing a substrate, comprising:
    forming a dielectric layer on a surface of a substrate;
    depositing an anti-reflective coating on a dielectric layer by reacting a processing gas comprising an oxygen-free silane-based compound and an oxygen-containing organosilicon compound to deposit a nitrogen-free dielectric material on the substrate, wherein the anti-reflective coating comprises silicon and oxygen and the oxygen-free silane-based compound has the formula Si$_x$H$_{2x+2}$ or Si$_x$Cl$_{2x+2}$ and X is 1 to 4;
    depositing a photoresist material on the anti-reflective coating; and
    patterning the photoresist layer.

12. The method of claim 11, further comprising:
    etching the anti-reflective coating and any underlying dielectric material to define an interconnect opening therethrough; and
    depositing one or more conductive materials to fill the interconnect opening.

13. The method of claim 11, wherein the oxygen-free silane-based compound is selected from the group of silane, disilane, chlorosilane, dichlorodisilane, and combinations thereof.

14. The method of claim 11, wherein the oxygen-containing organosilicon compound is selected from the group of tetraethoxysilane (TEOS), triethoxyfluorosilane (TEFS), 1,3,5,7-tetramethylcyclotetrasiloxane (TMCTS), dimethyldiethoxy (DMDE) silane, and combinations thereof.

15. The method of claim 14, wherein the ratio of the oxygen-free silane-based compound to the oxygen-containing organosilicon compound is between about 1 sccm:20 mgm and about 6 sccm:5 mgm.

16. The method of claim 11, wherein the dielectric material comprises silicon, oxygen, and carbon, and has an oxygen content between about 15 atomic % and about 50 atomic % of oxygen.

17. The method of claim 11, wherein the processing gas further comprises an inert gas, an oxygen and carbon source, or combinations thereof, wherein the inert gas is selected from the group consisting of argon, helium, neon, xenon, krypton, and combinations thereof, and the oxygen and carbon source is selected from the group consisting of carbon monoxide, carbon dioxide, and combinations thereof.

18. The method of claim 11, wherein the deposited nitrogen-free dielectric material has an index of refraction between about 1.5 and about 2.2 and an extinction coefficient of between about 0.3 and about 0.9.

19. The method of claim 11, further comprising exposing the deposited nitrogen-free dielectric material to an annealing process or to a plasma treatment process.

20. The method of claim 11, wherein the reacting the processing gas comprises generating a plasma with a RF power source having a high frequency RF power capacity, a low frequency capacity or both.

21. A method for processing a substrate, comprising:
    depositing at least one organic or inorganic dielectric layer on a substrate surface;
    forming a hardmask layer on the at least one organic or inorganic dielectric layer, wherein the hardmask layer is deposited by a process comprising reacting a processing gas comprising an oxygen-free silane-based compound and an oxygen-containing organosilicon compound to deposit a nitrogen-free dielectric material on the substrate, wherein the hardmask layer comprises silicon and oxygen, the oxygen-free silane-based compound has the formula $Si_xH_{2X+2}$ or $Si_xCl_{2X+2}$ and X is 1 to 4, and has a selectivity of oxide to hardmask of about 4:1 or greater;

defining a pattern in at least one region of the hardmask layer; and forming a feature definition in the at least one organic or inorganic dielectric layer by the pattern formed in the at least one region of the hardmask layer.

22. The method of claim 21, wherein the oxygen-free silane-containing compound is selected from the group of silane, disilane, chlorosilane, dichlorodisilane, and combinations thereof.

23. The method of claim 21, wherein the organosilicon compound is selected from the group of tetraethoxysilane (TEOS), triethoxyfluorosilane (TEFS), 1,3,5,7-tetramethylcyclotetrasiloxane (TMCTS), dimethyldiethoxy (DMDE) silane, and combinations thereof.

24. The method of claim 21, wherein the ratio of the oxygen-free silane-containing compound to the oxygen-containing organosilicon compound is between about 1 sccm:20 mgm and about 6 sccm:5 mgm.

25. The method of claim 21, wherein the dielectric material comprises silicon, oxygen, and carbon, and has an oxygen content between about 15 atomic % and about 50 atomic % of oxygen.

26. The method of claim 21, wherein the processing gas further comprises an inert gas, an oxygen and carbon source, or combinations thereof, wherein the inert gas is selected from the group of argon, helium, neon, xenon, krypton, and combinations thereof, and combinations thereof, and the oxygen and carbon source is selected from the group consisting of carbon monoxide, carbon dioxide, and combinations thereof.

27. The method of claim 21, wherein the reacting the processing gas comprises generating a plasma at a RF power source having a high frequency RF power capacity, a low frequency capacity, or both.

28. The method of claim 1, wherein reacting the processing gas comprises supplying silane to a plasma processing chamber at a flow rate between about 100 sccm and about 700 sccm, supplying tetraethoxysilane to the plasma processing chamber at a flow rate of about 2000 mgm or greater, supplying helium at a flow rate between about 500sccm and about 10,000sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

29. The method of claim 11, wherein reacting the processing gas comprises supplying silane to a plasma processing chamber at a flow rate between about 100 sccm and about 700 sccm, supplying tetraethoxysilane to the plasma processing chamber at a flow rate of about 2000 mgm or greater, supplying helium at a flow rate between about 500sccm and 10,000sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

30. The method of claim 11, wherein the dielectric layer comprises a silicon oxycarbide material.

31. The method of claim 11, wherein the dielectric layer is deposited on a barrier layer material.

32. The method of claim 31, wherein the barrier layer material comprises an oxygen-doped silicon carbide material.

33. The method of claim 21, further comprising exposing the deposited nitrogen-free dielectric material to an annealing process or to a plasma treatment process.

34. The method of claim 21, wherein reacting the processing gas comprises supplying silane to a plasma processing chamber at a flow rate between about 100 sccm and about 700 sccm, supplying tetrahoxysilane to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

35. The method of claim 21, wherein the at least one organic or inorganic dielectric layer comprises a silicon oxycarbide material.

36. The method of claim 21, wherein the dielectric layer is deposited on a barrier layer material.

37. The method of claim 36, wherein the barrier layer material comprises an oxygen-doped silicon carbide material.

* * * * *

UNITED STATES PATENT AND TRADEMARK OFFICE
CERTIFICATE OF CORRECTION

PATENT NO. : 7,105,460 B2
APPLICATION NO. : 10/193489
DATED : September 12, 2006
INVENTOR(S) : Kim et al.

Page 1 of 1

It is certified that error appears in the above-identified patent and that said Letters Patent is hereby corrected as shown below:

Title Page, Item (56), References Cited, FOREIGN PATENT DOCUMENTS: Please include the following reference:

--WO 99/41423    08/1999--

Column 4, Line 20: Delete the comma after "dielectric material"

Column 7, Line 48: After "about", delete "sccm"

Column 7, Line 50: Change "K" to --κ--

Column 9, Line 38: Change "my" to --may--

Column 15, Claim 26, Line 34: After "group", insert --consisting--

Column 15, Claim 26, Line 35: Delete the second instance of "and combinations thereof,"

Column 16, Claim 34, Line 32: Change "tetrahoxysilane" to --tetraethoxysilane--

Signed and Sealed this

Thirteenth Day of March, 2007

JON W. DUDAS
*Director of the United States Patent and Trademark Office*